(12) United States Patent
Hu et al.

(10) Patent No.: US 12,165,606 B2
(45) Date of Patent: Dec. 10, 2024

(54) DISPLAY PANEL AND DISPLAY DEVICE

(71) Applicant: TCL CHINA STAR OPTOELECTRONICS TECHNOLOGY CO., LTD., Guangdong (CN)

(72) Inventors: Chunxiao Hu, Guangdong (CN); Yoonsung Um, Guangdong (CN); Xiaojin He, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/756,640

(22) PCT Filed: Apr. 13, 2022

(86) PCT No.: PCT/CN2022/086608
§ 371 (c)(1),
(2) Date: May 29, 2022

(87) PCT Pub. No.: WO2023/178750
PCT Pub. Date: Sep. 28, 2023

(65) Prior Publication Data
US 2024/0161710 A1    May 16, 2024

(30) Foreign Application Priority Data
Mar. 25, 2022  (CN) .......................... 202210305511.9

(51) Int. Cl.
*G09G 3/36*    (2006.01)
*G02F 1/1362*  (2006.01)
*H01L 27/12*   (2006.01)

(52) U.S. Cl.
CPC ..... *G09G 3/3614* (2013.01); *G02F 1/136286* (2013.01); *H01L 27/124* (2013.01);
(Continued)

(58) Field of Classification Search
CPC ............... G06F 3/0446; G06F 3/04164; G06F 2203/04112
(Continued)

(56) References Cited

U.S. PATENT DOCUMENTS

2011/0187682 A1    8/2011  Kim et al.
2012/0162162 A1 *  6/2012  Kong ................ G02F 1/134363
                                              257/E33.012
(Continued)

FOREIGN PATENT DOCUMENTS

CN    101226290 A       7/2008
CN    110837195 A   *   2/2020   ......... G02F 1/13624
(Continued)

OTHER PUBLICATIONS

International Search Report in International application No. PCT/CN2022/086608, mailed on Dec. 15, 2022.
Written Opinion of the International Search Authority in International application No. PCT/CN2022/086608, mailed on Dec. 15, 2022.
Chinese Office Action issued in corresponding Chinese Patent Application No. 202210305511.9 dated Jun. 21, 2023, pp. 1-7.

*Primary Examiner* — Mark Edwards
(74) *Attorney, Agent, or Firm* — PV IP PC; Wei Te Chung

(57) ABSTRACT

A display panel and a display device are provided in embodiments of the present application, the display panel includes: a plurality of sub-pixels, each of the sub-pixels includes a main area and a sub-area; a plurality of data lines connected to sub-pixels with a same polarity in adjacent pixel groups; a plurality of gate lines, each of which is
(Continued)

connected to a part of sub-pixels in adjacent rows of sub-pixels; and a plurality of shared discharge bars, at least one shared discharge bar is disposed in the pixel group, and the shared discharge bars are connected to the sub-areas of the sub-pixels. Viewing angles of the display device can be improved.

20 Claims, 2 Drawing Sheets

(52) U.S. Cl.
CPC ............... *G09G 2300/0452* (2013.01); *G09G 2320/028* (2013.01)

(58) Field of Classification Search
USPC .......................................................... 345/174
See application file for complete search history.

(56) References Cited

U.S. PATENT DOCUMENTS

| | | | |
|---|---|---|---|
| 2015/0002497 A1* | 1/2015 | Dong | ................... G09G 3/3655 345/87 |
| 2016/0306454 A1* | 10/2016 | Wang | ..................... G06F 3/0412 |
| 2021/0056924 A1* | 2/2021 | Xiao | ..................... G09G 3/3688 |

FOREIGN PATENT DOCUMENTS

| | | | | |
|---|---|---|---|---|
| CN | 111341235 A | | 6/2020 | |
| CN | 112086077 A | * | 12/2020 | ....... G02F 1/136286 |
| CN | 112198726 A | * | 1/2021 | ........... G02F 1/1333 |
| KR | 20110089513 A | | 8/2011 | |

* cited by examiner

DISPLAY PANEL AND DISPLAY DEVICE

FIELD OF DISCLOSURE

The present application relates to a technical field of displays, and specifically to a display panel and a display device.

BACKGROUND OF DISCLOSURE

Thin film transistor-liquid crystal displays (TFT-LCDs) are one of main products of current panel displays. With development of large-size and high-resolution TFT-LCD display products, greater requirements, such as transmittance and viewing angles, have been placed on display quality of display.

Wherein, a data line sharing (DLS) architecture is increasingly used in display devices. The DLS architecture is an architecture in which adjacent sub-pixels on left and right share a data line, and a number of data lines is halved, which can save a number of IC chips, thereby achieving an effect of reducing cost. However, viewing angles of the display devices with an existing DLS architecture are poor, resulting in a poor display effect of the display devices.

TECHNICAL PROBLEM

Viewing angles of display devices with an existing DLS architecture are poor, resulting in a poor display effect of the display devices.

SUMMARY OF DISCLOSURE

A display panel and a display device are provided in embodiments of the present application, so as to solve a problem that viewing angles of the display device with an existing DLS architecture are poor, resulting in a poor display effect of the display device.

In a first aspect, an embodiment of the present application provides a display panel, comprising:
  a plurality of sub-pixels disposed in an array, each of the sub-pixels comprising a main area and a sub-area;
  a plurality of data lines, the data lines being disposed between two adjacent pixel groups, each of the data lines being connected to the sub-pixels with a same polarity in the adjacent pixel groups; wherein the pixel groups comprise two adjacent columns of the sub-pixels, the polarity comprises a first polarity and a second polarity; a voltage of the first polarity is greater than a reference voltage, and a voltage of the second polarity is less than the reference voltage;
  a plurality of gate lines, the gate lines being disposed between two adjacent rows of the sub-pixels, and each of the gate lines being connected to a part of the sub-pixels in the two adjacent rows of the sub-pixels; and
  a plurality of shared discharge bars, at least one of the shared discharge bars being disposed in the pixel group, each of the shared discharge bars having a first voltage or a second voltage, the first voltage being less than the second voltage; the shared discharge bar with the first voltage being connected to the sub-pixels with the first polarity, the shared discharge bar with the second voltage being connected to the sub-pixels with the second polarity, and the shared discharge bars being connected to the sub-areas of the sub-pixels.

In a second aspect, an embodiment of the present application further provides a display device, comprising:
  a display panel, the display panel as mentioned above; and
  a backlight module, disposed on one side of the display panel.

The display panel and the display device in the embodiments of the present application, one data line is disposed between every two adjacent pixel groups, and two gate lines are disposed between every two adjacent rows of sub-pixels, and at least one shared discharge bar is set in each of the pixel groups, namely, a structure of setting a shared discharge bar in a DLS pixel structure is realized; the shared discharge bars can discharge the sub-areas of the sub-pixels connected to it, for example, the sub-pixels with negative polarity can be connected to the shared discharge bars with the second voltage correspondingly, and the sub-pixels with positive polarity can be connected to the shared discharge bars with the first voltage correspondingly; a ratio of a voltage of the sub-area to a voltage of the main area can be reduced in a case of a low gray scale by supplying alternating current power to the shared discharge bars such that viewing angles of the display device are improved, and the viewing angles of the display device are further improved on a basis of reducing cost of the display device by reducing data lines and chips.

DETAILED DESCRIPTION OF PREFERRED EMBODIMENTS

Technical solutions in embodiments of the present application will be clearly and completely described below with reference to accompanying drawings in the embodiments of the present application. Obviously, described embodiments are only a part of the embodiments of the present application, but not all of the embodiments. Based on the embodiments in the present application, all other embodiments obtained by those skilled in the art without creative efforts shall fall within a protection scope of this application.

In order to solve a problem that viewing angles of a display device with an existing DLS architecture are poor, resulting in a poor display effect of the display device, an embodiment of the present application provides a display panel and a display device, which will be described below with reference to accompanying drawings.

Figure 1:
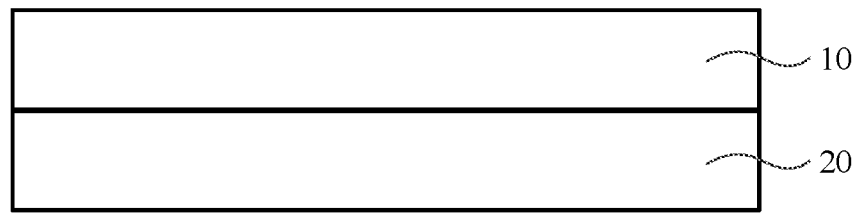
FIG. 1 is a side structural schematic diagram of a display device in an embodiment of the present application.

Exemplarily, please refer to FIG. 1, FIG. 1 is a side structural schematic diagram of a display device in an embodiment of the present application. The embodiment of the present application provides a display device 1, and the display device 1 may include a display panel 10 and a backlight module 20. Viewed from one side of the display device 1, the backlight module 20 may be disposed on one side of the display panel 10, namely, the display panel 10 and the backlight module 20 are disposed in a stack. Viewed from a display surface of the display device 1, the backlight module 20 may overlap with the display panel 10. The backlight module 20 is used to provide a backlight source for the display panel 10. The display panel 10 is used to display a screen. Exemplarily, the display device 1 may be a liquid crystal display (LCD) type display device, and a structure of the LCD is to place a liquid crystal cell in two parallel glass substrates. A thin film transistor (TFT) is disposed on a lower substrate glass, a color filter can be disposed on an upper substrate glass, and the color filter can also be disposed on the lower substrate glass. A rotation direction of liquid crystal molecules is controlled by a signal change and a voltage change on the TFT, so as to control whether polarized light of each pixel is emitted or not to achieve a display purpose. An LCD is a type of flat panel display, which has advantages of low power consumption, small size, and low radiation. The LCD is used in a wide range of scenarios, for example, the display device 1 can be a mobile electronic device such as a mobile phone and a tablet computer; the display device 1 can also be a device with a display function such as a TV, a car computer, and a computer.

Wherein, thin film transistor-liquid crystal displays are one of main products of current panel displays. With development of large-size and high-resolution TFT-LCD display products, greater requirements, such as transmittance and viewing angles, have been placed on display quality of the displays. In addition, compared with in-plane switching liquid crystal displays (IPS-LCDs) and organic light-emitting diodes (OLEDs), vertical alignment LCDs (VA-LCDs) have poor viewing angles. Therefore, viewing angle enhancement has always been a focus for VA-LCD researchers. A DLS architecture is increasingly used in display devices. The DLS architecture is an architecture in which adjacent sub-pixels on left and right share a data line, and a number of data lines is halved, which can save a number of IC chips, thereby realizing an effect of reducing cost. However, viewing angles of the display devices with an existing DLS architecture are poor, resulting in a poor display effect of the display devices.

In order to solve the above-mentioned problems, the embodiments of the present application improve a structure of the display panel 10, which will be described below with reference to the accompanying drawings.

Figure 2:
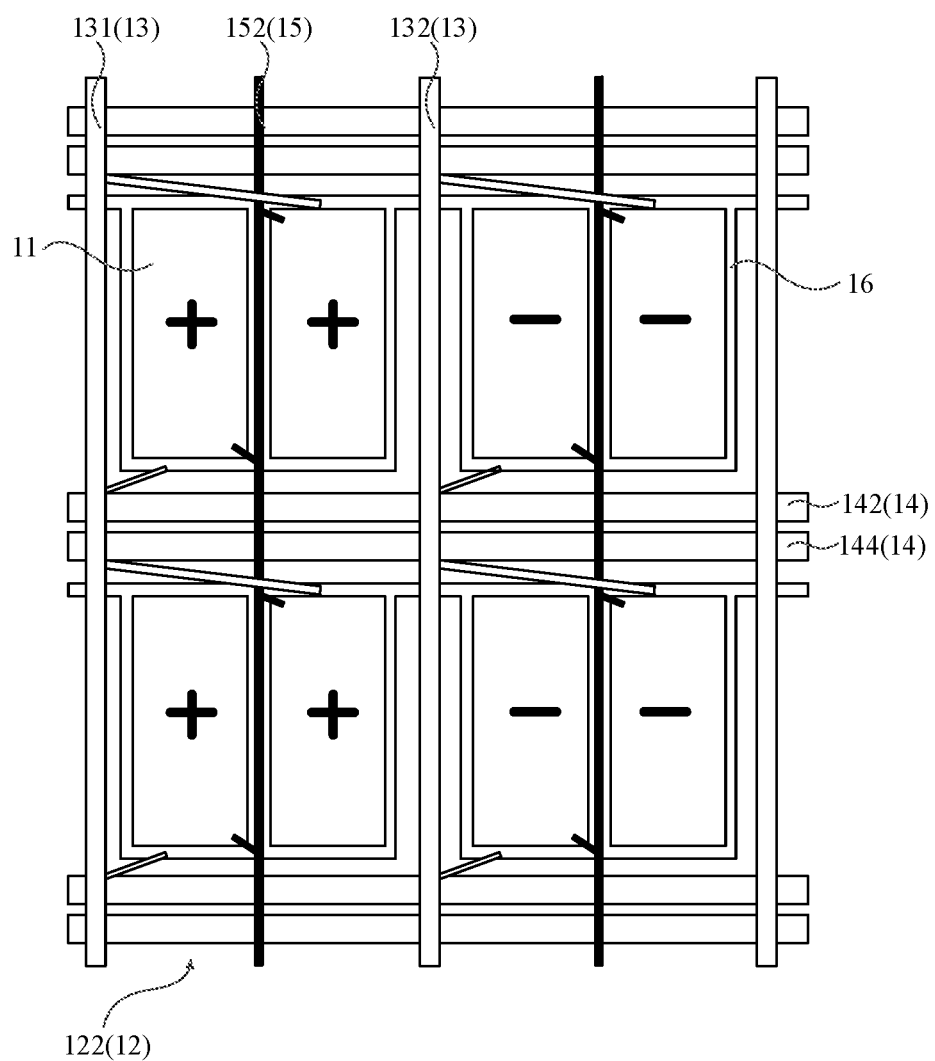
FIG. 2 is a schematic diagram of a first structure of a display panel in the display device shown in FIG. 1.
Figure 3:
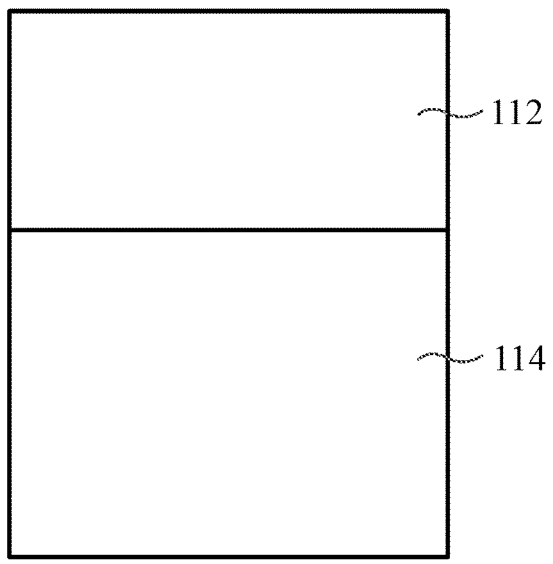
FIG. 3 is a schematic structural diagram of a sub-pixel in the display panel shown in FIG. 2.

Exemplarily, please refer to FIG. 2 and FIG. 3 in conjunction with FIG. 1. FIG. 2 is a schematic diagram of a first structure of a display panel in the display device shown in FIG. 1, and FIG. 3 is a schematic structural diagram of a sub-pixel in the display panel shown in FIG. 2. An embodiment of the present application provides a display panel 10, and the display panel 10 may include a plurality of sub-pixels 11, a plurality of data lines 13, a plurality of gate lines 14, and a plurality of shared discharge bars 15. The plurality of sub-pixels 11 may be disposed in an array, and every two adjacent columns of the sub-pixels 11 form a pixel group 12. Each of the sub-pixels 11 includes a main area 112 and a sub-area 114, and each of the sub-pixels 11 has a first polarity or a second polarity; a voltage of the sub-pixels 11 with the first polarity may be greater than a reference voltage, and a voltage of the sub-pixels 11 with the second polarity may be less than the reference voltage. The reference voltage can be understood as an average value of the voltages that can be transmitted in the sub-pixels 11. In addition, polarities of the data lines 13 and the shared discharge bars 15 can also be determined with reference to the polarities of the sub-pixels 11, namely, the polarities may include a first polarity and a second polarity; a voltage of the first polarity is greater than the reference voltage, and a voltage of the second polarity is less than the reference voltage. Exemplarily, the first polarity may be a positive polarity, and the second polarity may be a negative polarity. The plurality of sub-pixels 11 may constitute a pixel unit, for example, three RGB sub-pixels constitute a pixel unit, and a plurality of the pixel units are disposed in an array, so that light of different colors can be emitted in different areas of the display panel 10, making the display panel 10 present different screen display. The data lines 13 are used to provide data signals for the sub-pixels 11 to control display of the display panel 10. Wherein, one data line 13 is disposed between every two adjacent pixel groups 12, and each of the data lines 13 is connected to the sub-pixels 11 with a same polarity in adjacent pixel groups 12. Two gate lines 14 are disposed between every two adjacent rows of the sub-pixels 11, and each of the gate lines 14 is connected to part of the sub-pixels 11 in adjacent rows of the sub-pixels 11, respectively. For example, one gate line 14 may be connected to a part of the sub-pixels 11 in a row of the sub-pixels 11, for example, a first, a third, a fifth, and a last odd-numbered sub-pixels 11 in a row of the sub-pixels 11 are connected to the above-mentioned gate lines 14. Correspondingly, a second, a fourth, a sixth, and a last even-numbered sub-pixels 11 in a row of the sub-pixels 11 are connected to another gate line 14 located on an opposite side of the row of the sub-pixels 11 of the above-mentioned gate line 14. Wherein, the gate line 14 may also be called a scan line, which is used to provide scan signals for the sub-pixels 11.

Exemplarily, at least one shared discharge bar 15 is disposed in each of the pixel groups 12, and each of the shared discharge bars 15 has a first voltage or a second voltage; the first voltage is less than the second voltage; the shared discharge bar 15 with the first voltage may be connected to the sub-pixels 11 with the first polarity, and the shared discharge bar 15 with the second voltage may be connected to the sub-pixels 11 with the second polarity. The shared discharge bars 15 are connected to the sub-areas 114 of the sub-pixels 11 to discharge voltage of the sub-areas 114 of the sub-pixels 11 through the shared discharge bars 15. For example, each of the shared discharge bars 15 may be disposed between two columns of the sub-pixels 11 in one pixel group 12. Light transmittance of the sub-pixels 11 won't be affected by arranging the shared discharge bars 15 in this way, and an aperture ratio of the display panel 10 and display resolution of the display panel 10 won't be affected either. For another example, the sub-pixels 11 with a positive polarity can be connected to the shared discharge bar 15 that transmits the first voltage, and the sub-pixels 11 with a negative polarity can be connected to the shared discharge bar 15 that transmits the second voltage. A ratio of a voltage of the sub-area 114 to a voltage of the main area 112 can be reduced in a case of a low gray scale by a way of supplying alternating current power to the shared discharge bars 15; namely, a low color shift (LCS) value is reduced, thereby improving viewing angles of the display panel 10. At a same time, in the way of supplying alternating current power to the shared discharge bars 15, the LCS value can also be increased in a case of a high gray scale; namely, the ratio of the voltage of the sub-area 114 to the voltage of the main area 112 can be increased in the case of the high gray scale such that transmittance of the display panel 10 is improved.

By setting one data line 13 between every two adjacent pixel groups 12, and setting two gate lines 14 between every two adjacent rows of the sub-pixels 11, and setting at least one shared discharge bar 15 in each of the pixel groups 12; namely, a structure of setting the shared discharge bars 15 in a DLS pixel structure is realized, and the shared discharge bars 15 can perform discharge on the sub-areas 114 of the sub-pixels 11 connected thereto. For example, the sub-pixels 11 with the negative polarity can be correspondingly connected to the shared discharge bar 15 that transmits the second voltage, and the sub-pixels 11 with the positive polarity can be correspondingly connected to the shared discharge bar 15 that transmits the first voltage. The ratio of the voltage of the sub-area to the voltage of the main area can be reduced in the case of the low gray scale by the way of supplying alternating current power to the shared discharge bars 15, such that the viewing angles of the display device 1 are improved, and the viewing angles of the display device 1 are further improved on a basis of reducing cost of the display device 1 by reducing data lines and chips.

It should be noted that the above-mentioned two adjacent columns of the sub-pixels 11 share one data line 13, and two gate lines 14 are disposed between two adjacent rows of the sub-pixels 11, which constitutes a pixel design method of the DLS architecture. Since a number of the data lines 13 is proportional to a number of chip on flex (COF) IC chips, compared with a 1G1D structure in which each column of the sub-pixels are connected to one data line and each row of the sub-pixels are connected to one gate line, the number of data lines 13 is halved, which can save the number of IC chips, thereby achieving the effect of reducing the cost.

It should be noted that for direct current shared discharge bar (DC sharebar), a voltage of the shared discharge bar is fixed, for example, it can be 8V. While positive and negative frames of the data lines are switched back and forth. Exemplarily, a voltage range may be 0.2V-14.2V; namely, the DC sharebar both discharges the sub-pixels with the positive polarity and the negative polarity. However, the voltage of the shared discharge bar 15 in the embodiment of the present application is variable, namely, an AC sharebar. For example, if the voltage of the shared discharge bar 15 is 7V in a positive frame and the voltage of the shared discharge bar 15 in a negative frame is 10V, and a voltage of the data line 13 is 14.2V in an L255 grayscale positive frame voltage and a voltage of the data line 13 is 0.2V in an L255 grayscale negative frame voltage, then the reference voltage can be considered to be 7.2V at this time; namely, the voltage 7V of the shared discharge bar 15 can be considered as the negative polarity and 10V as the positive polarity. In addition, a principle of improving viewing angles of the AC sharebar is: when the sub-pixels 11 is in the positive polarity, the voltage of the shared discharge bar 15 is a low potential, such as 7V; and when the sub-pixel 11 is negative, the voltage of the shared discharge bar 15 is a high potential, such as 10V. It should be noted that voltage values corresponding to different models are different, and the voltage values above-mentioned are only examples for description, and should not be construed as limitations on the voltage values. The LCS value is less at the low gray scale by the way of supplying alternating current power to the shared discharge bar 15, an effect in this way achieved is that the pixels in the sub-area 114 will light up later, thereby improving the viewing angles at the low gray scale. It should be noted that "the pixels in the sub-area 114 lighting up later" is not a situation that the main area and the sub-area are supplied power successively, but at the low gray scale the shared discharge bar 15 discharges an electric potential of the sub-area 114, Therefore, the voltage of the sub-area 114 is relatively low, and it will light up later.

It should be noted that a structural composition of the display panel 10 is not limited to above-mentioned parts. Exemplarily, the display panel 10 may further include a plurality of common electrodes 16, and the plurality of common electrodes 16 may correspondingly surround the plurality of sub-pixels 11, respectively. Of course, for different display panels 10, arrangement of the common polarity 16 may be different; namely, the arrangement of the common polarity 16 is not limited to the above-mentioned arrangement. The embodiments of the present application are described by taking the common electrodes 16 surrounding the sub-pixels 11 as an example. The common electrodes in each row of the common electrodes 16 are connected with each other. Each of the shared discharge bars 15 is disposed between two adjacent columns of common electrodes 16. For example, each of the shared discharge bars 15 is stacked on an area where two adjacent columns of the common electrodes 16 are connected. It should be noted that an area where the common electrodes 16 are located may be a non-aperture area of the sub-pixels 11, and an area of the sub-pixels 11 surrounded by the common electrodes 16 may be an aperture area of the sub-pixels 11, and the aperture area may transmit light. For example, a pixel electrode of the sub-pixel 11 may be a metal wire made of a transparent material, such as indium tin oxide (ITO). Setting the shared discharge bars 15 on an area where the common electrodes 16 are connected, namely, setting the shared discharge bars 15 in the non-aperture area of the display panel 10, can reduce a loss of an aperture ratio, thereby improving resolution of the pixels.

Wherein, arrangements of the sub-pixels 11 with different polarities correspond to different arrangement structures of shared discharge bars 15. The following will be divided into two cases to explain.

In a first case, please continue to refer to FIG. 2, an arrangement of Column+Stripe. In this case, the polarity of the two columns of the sub-pixels 11 in each of the pixel groups 12 are a same first polarity; a first shared discharge bar 152 with the second polarity is disposed between the two columns of the sub-pixels 11 in each of the pixel groups 12, and the first shared discharge bar 152 is connected to all of the sub-pixels 11 in the pixel group 12 where it is located. For example, the first polarity may be positive polarity, and the second polarity may be negative polarity.

In order to explain a structure of the display panel 10 in this case more clearly, a structural composition of a certain area in the display panel 10 is taken as an example for description. The display panel 10 may include a first pixel group 122, a first data line 131, a second data line 132, and a first shared discharge bar 152; and the first pixel group 122 includes two columns of the sub-pixels 11 with the first polarity. The first data line 131 is disposed on one side of the first pixel group 122; the first data line 131 is with the first polarity, and the first data line 131 is connected to all of the sub-pixels 11 in the first pixel group 122. The second data line 132 is disposed on another side of the first pixel group 122 opposite to the first data line 131, and the second data line 132 is with the second polarity, the second data line 132 may be connected to all of the sub-pixels 11 with the second polarity in the pixel group 12 adjacent to the first pixel group 122. For example, the two columns of the sub-pixels 11 in the first pixel group 122 are with positive polarity, then the first data lines 131 and the second data lines 132 located on left and right sides of the first pixel group 122 are with positive polarity and negative polarity, respectively; the first data line 131 is connected to all of the sub-pixels 11 in the first pixel group 122 with a same polarity, and the second data line 132 may be connected to another pixel group 12 with the negative polarity adjacent to the first pixel group 122. Namely, one data line 13 is disposed between two adjacent pixel groups 12, polarities of the adjacent two pixel groups 12 are opposite, and polarities of adjacent data lines 13 are also opposite.

The first shared discharge bars 152 are disposed between the two columns of the sub-pixels 11 in the first pixel group 122, and the first shared discharge bars 152 may be with the second polarity, namely, the negative polarity. The first shared discharge bars 152 are connected to all of the sub-pixels 11 in the first pixel group 122, respectively. It can be understood that the shared discharge bar 15 with the negative polarity is connected to the sub-pixels 11 with the positive polarity, and the shared discharge bar 15 with the positive polarity is connected to the sub-pixels 11 with the negative polarity, so that discharging the sub-area 114 of the sub-pixels 11 is realized; the ratio of the voltage of the sub-area 114 to the voltage of the main area 112 at the low gray scale is reduced by the way of supplying alternating current power to the shared discharge bars 15, thus improving the viewing angles of the display panel 10.

Figure 4:
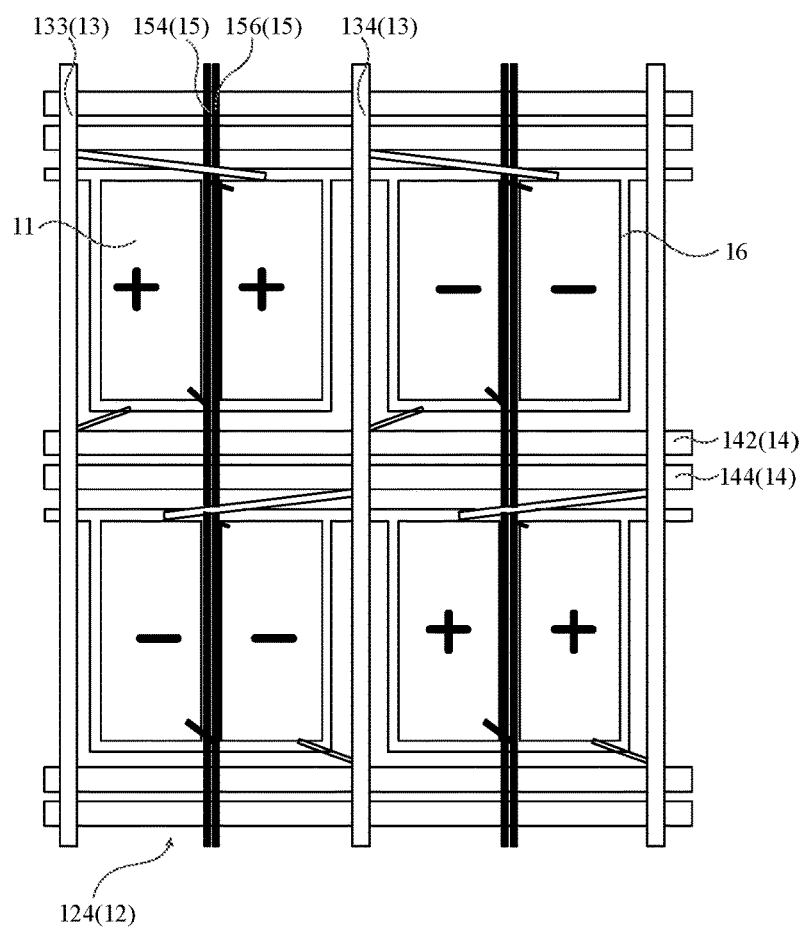
FIG. 4 is a schematic diagram of a second structure of the display panel in the display device shown in FIG. 1.

In a second case, please refer to FIG. 4 in conjunction with FIG. 1 to FIG. 3, FIG. 4 is a schematic diagram of a second structure of the display panel in the display device shown in FIG. 1. An arrangement of Column+Flip, in this case, polarities of adjacent rows of the sub-pixels 11 in each column of the sub-pixels 11 in each of the pixel groups 12 are opposite, and polarities of adjacent columns of the sub-pixels 11 in each row of the sub-pixels 11 in the each pixel group 12 are same; namely, the polarities of each column of the sub-pixels 11 are staggered. At this time, two shared discharge bars 15 are disposed between the two columns of the sub-pixels 11 in each of the pixel groups 12.

Exemplarily, taking another area of the display panel 10 as an example, the display panel 10 may include a second pixel group 124, a third data line 133, a fourth data line 134, a second shared discharge bar 154, and a third shared discharge bar 156. The second pixel group 124 includes two columns of the sub-pixels 11; polarities of each column of the sub-pixels 11 are alternately arranged with the first polarity and the second polarity, and polarities of two sub-pixels 11 in each row of the second pixel group 124 are same. The third data line 133 is disposed on one side of the second pixel group 124, and the third data line 133 may be with the first polarity, and the third data line 133 is connected to every other row of the sub-pixels 11 with the first polarity in the second pixel group 124. The fourth data line 134 is disposed on another side of the second pixel group 124 opposite to the third data line 133; the fourth data line 134 is with the second polarity, and the fourth data line 134 is connected to every other row of the sub-pixels 11 with the second polarity in the second pixel group 124.

The second shared discharge bar 154 is with the second polarity, the second shared discharge bar 154 is connected to every other row of the sub-pixels 11 with the first polarity in the pixel group 12 where it is located, so as to discharge the voltage of the sub-area 114 of the sub-pixels 11 with the first polarity in the pixel group 12 such as the second pixel group 124 through the second shared discharge bar 154. The third shared discharge bar 156 may be adjacent to the second shared discharge bar 154 to be insulated from each other. The third shared discharge bar 156 may be with the first polarity, and the third shared discharge bar 156 is connected to every other row of the sub-pixels 11 with the second polarity in the pixel group 12 where the third shared discharge bar 156 is located, such as the second pixel group 124, so as to discharge the voltage of the sub-area 114 of the sub-pixels 11 with the second polarity in the pixel group 12 such as the second pixel group 124 through the third shared discharge bar 156. Wherein, the second shared discharge bar 154 is connected to the sub-pixels 11 with the first polarity by bypassing the third shared discharge bar 156, and the third shared discharge bar 156 is connected to the sub-pixels 11 with the second polarity by bypassing the second shared discharge bar 154. For example, during manufacture, the above-mentioned surrounding can be realized by means of vias and wires.

It can be understood that the shared discharge bar 15 with the negative polarity is connected to the sub-pixels 11 with the positive polarity, and the shared discharge bar 15 with the positive polarity is connected to the sub-pixels 11 with the negative polarity, so that the sub-area 114 of the sub-pixels 11 are discharged to reduce the LCS value at the low gray scale, thereby improving the viewing angles of the display panel 10.

Of course, an arrangement of polarity of the sub-pixels 11 can also have other forms, and the arrangement of the corresponding shared discharge bars 15 is correspondingly changed, which will not be illustrated here.

Wherein, no matter it is the first case or the second case, two gate lines 14 are disposed between every two adjacent rows of sub-pixels 11. The two gate lines 14 may include a first gate line 142 and a second gate line 144, and the first gate line 142 may be connected to one sub-pixel 11 in each of the pixel groups 12 in a row of the sub-pixels 11. The second gate line 144 is adjacent to the first gate line 142, and the second gate line 144 is connected to another sub-pixel 11 in each of the pixel groups 12 in an adjacent row of the sub-pixels 11; namely, the second gate line 144 is connected to another sub-pixel 11 that is staggered from the sub-pixel 11 connected to the first gate line 142.

Exemplarily, in the first case, the first gate line 142 may be connected a first sub-pixel, a third sub-pixel, a fifth sub-pixel, and an odd-numbered sub-pixel 11 in a row of the sub-pixels 11; in addition, polarities of the first sub-pixel, the third sub-pixel, the fifth sub-pixel, and the odd-numbered sub-pixel 11 are staggered; for example, the first sub-pixel 11 is with the positive polarity, the third sub-pixel 11 is with the negative polarity, and the fifth sub-pixel 11 is with the positive polarity. The second gate line 144 may be connected to a second sub-pixel, a fourth sub-pixel, a sixth sub-pixel, and an even-numbered sub-pixel 11 in the above-mentioned adjacent row of sub-pixels 11; in addition, polarities of the second sub-pixel, the fourth sub-pixel, the sixth sub-pixel, and the even-numbered sub-pixel 11 are staggered; for example, the second sub-pixel 11 is with the positive polarity, the fourth sub-pixel 11 is with the negative polarity, and the sixth sub-pixel 11 is with the positive polarity. In the second case, connection modes of the first gate line 142 and the second gate line 144 are similar to that in the first case, and the above-mentioned description can be referred to, which will not be repeated here.

In the display panel 10 and the display device 1 provided by the embodiments of the present application, By setting one data line 13 between every two adjacent pixel groups 12, and setting two gate lines 14 between every two adjacent rows of the sub-pixels 11, and setting at least one shared discharge bar 15 in each of the pixel groups 12; namely, a structure of setting the shared discharge bars 15 in a DLS pixel structure is realized, and the shared discharge bars 15 can perform discharge on the sub-areas 114 of the sub-pixels 11 connected thereto. For example, the sub-pixels 11 with the negative polarity can be correspondingly connected to the shared discharge bar 15 that transmits the second voltage, and the sub-pixels 11 with the positive polarity can be correspondingly connected to the shared discharge bar 15 that transmits the first voltage. The ratio of the voltage of the sub-area to the voltage of the main area can be reduced in the case of the low gray scale by the way of supplying alternating current power to the shared discharge bars 15, such that the viewing angles of the display device 1 are improved, and the viewing angles of the display device 1 are further improved on a basis of reducing the cost of the display device 1 by reducing the data lines and the chips.

In the above-mentioned embodiments, the description of each embodiment has its own emphasis. For parts that are not described in detail in a certain embodiment, reference may be made to the relevant descriptions of other embodiments.

In the description of this application, terms "first" and "second" are only used for description purposes, and cannot be understood as indicating or implying relative importance or implying a number of indicated technical features. So features defined as "first", "second" may expressly or implicitly include one or more features.

The display panel and the display device disposed by the embodiments of the present application have been introduced in detail above, principles and implementations of the present application are described herein using specific examples, and the descriptions of the above-mentioned embodiments are only used to help understand methods and core ideas of the present application; at a same time, for those skilled in the art, according to an idea of the present application, there will be changes in the specific embodiments and application scope. In conclusion, content of this description should not be construed as a limitation to the present application.

What is claimed is:

1. A display panel, wherein comprising:
a plurality of sub-pixels disposed in an array, each of the sub-pixels comprising a main area and a sub-area, a pixel group comprising two adjacent columns of the sub-pixels;
a plurality of data lines, the data lines being disposed between two adjacent pixel groups, each of the data lines being connected to the sub-pixels with a same polarity in the adjacent pixel groups; wherein the pixel groups comprise two adjacent columns of the sub-pixels, the polarity comprises a first polarity and a second polarity; a voltage of the first polarity is greater than a reference voltage, and a voltage of the second polarity is less than the reference voltage;
a plurality of gate lines, the gate lines being disposed between two adjacent rows of the sub-pixels, and each of the gate lines being connected to a part of the sub-pixels in the two adjacent rows of the sub-pixels; and
a plurality of shared discharge bars, at least one of the shared discharge bars being disposed in the pixel group, each of the shared discharge bars having a first voltage or a second voltage, the first voltage being less than the second voltage; the shared discharge bar with the first voltage being connected to the sub-pixels with the first polarity, the shared discharge bar with the second voltage being connected to the sub-pixels with the second polarity, and the shared discharge bars being connected to the sub-areas of the sub-pixels;
wherein each of the shared discharge bars is disposed between two columns of the sub-pixels in one of the pixel group;
wherein polarities of two columns of the sub-pixels in each of the pixel groups are the first polarity, a first shared discharge bar with the second polarity is disposed between the two columns of the sub-pixels in the each of the pixel groups, and the first shared discharge bar is connected to all of the sub-pixels in the pixel group where it is located.

2. The display panel as claimed in claim 1, wherein both sides of the each of the pixel groups are respectively disposed with:
a first data line with the first polarity, the first data line connected to all of the sub-pixels with the first polarity in the pixel group;
a second data line with the second polarity, the second data line connected to all of the sub-pixels with the second polarity in a pixel group adjacent to the above-mentioned pixel group.

3. The display panel as claimed in claim 1, wherein polarities of adjacent rows of the sub-pixels in each column of the sub-pixels in the each of the pixel groups are opposite, polarities of adjacent columns of the sub-pixels in each row of the sub-pixels in the each of the pixel groups are same; and two of the shared discharge bars are disposed between the two columns of the sub-pixels in the each of the pixel groups.

4. The display panel as claimed in claim 3, wherein the two of the shared discharge bars comprise:
a second shared discharge bar with the second polarity, the second shared discharge bar connected to the sub-pixels with the first polarity in the pixel group where it is located;
a third shared discharge bar with the first polarity being adjacent to the second shared discharge bar, and the third shared discharge bar connected to the sub-pixels with the second polarity in the pixel group where it is located.

5. The display panel as claimed in claim 4, wherein both sides of the each of the pixel groups are respectively disposed with:
a third data line with the first polarity, the third data line connected to the sub-pixels with the first polarity in the pixel group;
a fourth data line with the second polarity, the fourth data line connected to the sub-pixels with the second polarity in the pixel group.

6. The display panel as claimed in claim 4, wherein the second shared discharge bar is connected to the sub-pixels with the first polarity by bypassing the third shared discharge bar;
the third shared discharge bar is connected to the sub-pixels with the second polarity by bypassing the second shared discharge bar.

7. The display panel as claimed in claim 1, wherein between every two adjacent rows of the sub-pixels are disposed with:
a first gate line connecting one sub-pixel in each of the pixel groups in a row of the sub-pixels;
a second gate line being adjacent to the first gate line, and the second gate line connected to another sub-pixel in each of the pixel groups in an adjacent row of the sub-pixels.

8. The display panel as claimed in claim 1, wherein the display panel further comprises a plurality of common electrodes, and the plurality of common electrodes correspondingly surround the plurality of sub-pixels, respectively.

9. The display panel as claimed in claim 1, wherein a non-aperture area is disposed between the two adjacent columns of the sub-pixels, and the shared discharge bars are disposed in the non-aperture area.

10. A display device, wherein comprising:
a display panel, comprising:
a plurality of sub-pixels disposed in an array, each of the sub-pixels comprising a main area and a sub-area;
a plurality of data lines, the data lines being disposed between two adjacent pixel groups, each of the data lines being connected to the sub-pixels with a same polarity in the adjacent pixel groups; wherein the pixel groups comprise two adjacent columns of the sub-pixels, the polarity comprises a first polarity and a second polarity; a voltage of the first polarity is greater than a reference voltage, and a voltage of the second polarity is less than the reference voltage;
a plurality of gate lines, the gate lines being disposed between two adjacent rows of the sub-pixels, and each of the gate lines being connected to a part of the sub-pixels in the two adjacent rows of the sub-pixels; and
a plurality of shared discharge bars, at least one of the shared discharge bars being disposed in the pixel group, each of the shared discharge bars having a first voltage or a second voltage, the first voltage being less than the second voltage; the shared discharge bar with the first voltage being connected to the sub-pixels with the first polarity, the shared discharge bar with the second voltage being connected to the sub-pixels with the second polarity, and the shared discharge bars being connected to the sub-areas of the sub-pixels, wherein each of the shared discharge bars is disposed between two columns of the sub-pixels in one of the pixel groups; and
a backlight module, disposed on one side of the display panel;
wherein polarities of two columns of the sub-pixels in each of the pixel groups are the first polarity, a first shared discharge bar with the second polarity is disposed between the two columns of the sub-pixels in the each of the pixel groups, and the first shared discharge bar is connected to all of the sub-pixels in the pixel group where it is located.

11. The display device as claimed in claim 10, wherein both sides of the each of the pixel groups are respectively disposed with:
a first data line with the first polarity, the first data line connected to all of the sub-pixels with the first polarity in the pixel group;
a second data line with the second polarity, the second data line connected to all of the sub-pixels with the second polarity in a pixel group adjacent to the above-mentioned pixel group.

12. The display device as claimed in claim 10, wherein polarities of adjacent rows of the sub-pixels in each column of the sub-pixels in the each of the pixel groups are opposite, polarities of adjacent columns of the sub-pixels in each row of the sub-pixels in the each of the pixel groups are same; and two of the shared discharge bars are disposed between the two columns of the sub-pixels in the each of the pixel groups.

13. The display device as claimed in claim 12, wherein the two of the shared discharge bars comprise:
a second shared discharge bar with the second polarity, the second shared discharge bar connected to the sub-pixels with the first polarity in the pixel group where it is located;
a third shared discharge bar with the first polarity being adjacent to the second shared discharge bar, and the third shared discharge bar connected to the sub-pixels with the second polarity in the pixel group where it is located.

14. The display device as claimed in claim 13, wherein both sides of the each of the pixel groups are respectively disposed with:
a third data line with the first polarity, the third data line connected to the sub-pixels with the first polarity in the pixel group;
a fourth data line with the second polarity, the fourth data line connected to the sub-pixels with the second polarity in the pixel group.

15. The display device as claimed in claim 13, wherein the second shared discharge bar is connected to the sub-pixels with the first polarity by bypassing the third shared discharge bar;
the third shared discharge bar is connected to the sub-pixels with the second polarity by bypassing the second shared discharge bar.

16. The display device as claimed in claim 10, wherein between every two adjacent rows of the sub-pixels are disposed with:
a first gate line connecting one sub-pixel in each of the pixel groups in a row of the sub-pixels;
a second gate line being adjacent to the first gate line, and the second gate line connected to another sub-pixel in each of the pixel groups in an adjacent row of the sub-pixels.

17. A display device, wherein comprising:
a display panel, comprising:
a plurality of sub-pixels disposed in an array, each of the sub-pixels comprising a main area and a sub-area;
a plurality of data lines, the data lines being disposed between two adjacent pixel groups, each of the data lines being connected to the sub-pixels with a same polarity in the adjacent pixel groups; wherein the pixel groups comprise two adjacent columns of the sub-pixels, the polarity comprises a first polarity and a second polarity; a voltage of the first polarity is greater than a reference voltage, and a voltage of the second polarity is less than the reference voltage;
a plurality of gate lines, the gate lines being disposed between two adjacent rows of the sub-pixels, and each of the gate lines being connected to a part of the sub-pixels in the two adjacent rows of the sub-pixels; and
a plurality of shared discharge bars, at least one of the shared discharge bars being disposed in the pixel group, each of the shared discharge bars having a first voltage or a second voltage, the first voltage being less than the second voltage; the shared discharge bar with the first voltage being connected to the sub-pixels with the first polarity, the shared discharge bar with the second voltage being connected to the sub-pixels with the second polarity, and the shared discharge bars being connected to the sub-areas of the sub-pixels, wherein each of the shared discharge bars is disposed between two columns of the sub-pixels in one of the pixel groups; and
a backlight module, disposed on one side of the display panel;
wherein polarities of adjacent rows of the sub-pixels in each column of the sub-pixels in the each of the pixel groups are opposite, polarities of adjacent columns of the sub-pixels in each row of the sub-pixels in the each of the pixel groups are same; and two of the shared discharge bars are disposed between the two columns of the sub-pixels in the each of the pixel groups;

wherein the two of the shared discharge bars comprise:

a second shared discharge bar with the second polarity, the second shared discharge bar connected to the sub-pixels with the first polarity in the pixel group where it is located;

a third shared discharge bar with the first polarity being adjacent to the second shared discharge bar, and the third shared discharge bar connected to the sub-pixels with the second polarity in the pixel group where it is located.

18. The display device as claimed in claim 17, wherein polarities of two columns of the sub-pixels in each of the pixel groups are the first polarity;

a first shared discharge bar with the second polarity is disposed between the two columns of the sub-pixels in the each of the pixel groups, the first shared discharge bar is connected to all of the sub-pixels in the pixel group where it is located.

19. The display device as claimed in claim 17, wherein both sides of the each of the pixel groups are respectively disposed with:

a first data line with the first polarity, the first data line connected to all of the sub-pixels with the first polarity in the pixel group;

a second data line with the second polarity, the second data line connected to all of the sub-pixels with the second polarity in a pixel group adjacent to the above-mentioned pixel group.

20. The display device as claimed in claim 17, wherein between every two adjacent rows of the sub-pixels are disposed with:

a first gate line connecting one sub-pixel in each of the pixel groups in a row of the sub-pixels;

a second gate line being adjacent to the first gate line, and the second gate line connected to another sub-pixel in each of the pixel groups in an adjacent row of the sub-pixels.

\* \* \* \* \*